(12) United States Patent
Hatori et al.

(10) Patent No.: US 7,741,655 B2
(45) Date of Patent: Jun. 22, 2010

(54) SEMICONDUCTOR DEVICE

(75) Inventors: Kenji Hatori, Chiyoda-ku (JP); Atsushi Narazaki, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/020,959

(22) Filed: Jan. 28, 2008

(65) Prior Publication Data
US 2009/0072268 A1 Mar. 19, 2009

(30) Foreign Application Priority Data
Sep. 14, 2007 (JP) .............................. 2007-238625

(51) Int. Cl.
*H01L 29/739* (2006.01)

(52) U.S. Cl. .................. 257/133; 257/194; 257/335; 257/339; 257/342

(58) Field of Classification Search ................ 257/133, 257/194, 138–141, 144, 147, 163–168, 335, 257/339, 341–343, 378
See application file for complete search history.

(56) References Cited

U.S. PATENT DOCUMENTS

| 4,782,372 | A | * | 11/1988 | Nakagawa et al. | .......... 257/141 |
| 4,994,871 | A | * | 2/1991 | Chang et al. | .................. 257/139 |
| 5,703,383 | A | | 12/1997 | Nakayama | |
| 7,211,839 | B2 | * | 5/2007 | Kachi et al. | .................. 257/194 |
| 2003/0209741 | A1 | * | 11/2003 | Saitoh et al. | ................. 257/288 |
| 2005/0199953 | A1 | * | 9/2005 | Kawamura et al. | .......... 257/341 |
| 2006/0220151 | A1 | * | 10/2006 | Loechelt et al. | ............. 257/387 |

FOREIGN PATENT DOCUMENTS

| JP | 3-29328 | | 2/1991 |
| JP | 03029328 A | * | 2/1991 |
| JP | 8-125172 | | 5/1996 |
| JP | 8-288303 | | 11/1996 |
| JP | 10-242458 | | 9/1998 |
| JP | 2004-260140 | | 9/2004 |

* cited by examiner

*Primary Examiner*—Wai-Sing Louie
*Assistant Examiner*—Sue Tang
(74) *Attorney, Agent, or Firm*—Oblon, Spivak, McClelland, Maier & Neustadt, L.L.P.

(57) ABSTRACT

A semiconductor device includes a semiconductor substrate having a main surface and a semiconductor element having an insulated gate field effect portion formed in the semiconductor substrate. The semiconductor element includes an $n^-$ region, an n-type source region, a p-type base region, an $n^+$ region, and a gate electrode. The $n^-$ region and the n-type source region are formed in the main surface. The p-type base region is formed in the main surface adjacent to the n-type source region. The $n^+$ region is formed in the main surface adjacent to the p-type base region and opposed to the n-type source region with the p-type base region being interposed, and has an impurity concentration higher than the $n^-$ region. The $n^-$ region is formed in the main surface adjacent to the p-type base region and to the $n^+$ region.

10 Claims, 8 Drawing Sheets

SEMICONDUCTOR DEVICE

BACKGROUND OF THE INVENTION

1. Field of the Invention

The present invention relates to a semiconductor device and more particularly to a semiconductor device including a semiconductor element having an insulated gate field effect portion.

2. Description of the Background Art

A power semiconductor element such as a power MOSFET (Metal Oxide Semiconductor Field Effect Transistor), an IGBT (Insulated Gate Bipolar Transistor), and a diode is used as a semiconductor device for electric power applications. In order to reduce loss at the time of application of power, lower resistance and operation at higher speed are required in the power semiconductor element. In general, lower resistance and operation at higher speed are mutually contradictory in the power semiconductor element, and it has been difficult to manufacture a power semiconductor element having characteristics excellent in both of lower resistance and operation at higher speed.

For example, Japanese Patent Laying-Open No. 08-288303 (Patent Document 1) discloses a technique aiming to simultaneously achieve operation at higher speed and lower ON resistance. Patent Document 1 discloses a vertical field effect transistor including a high-concentration impurity region of a conductivity type opposite to a base region (third impurity diffusion region) at a side portion of the base region (second impurity diffusion region).

In addition, for example, Japanese Patent Laying-Open No. 10-242458 (Patent Document 2), Japanese Patent Laying-Open No. 08-125172 (Patent Document 3), and the like also disclose a structure where a high-concentration impurity region is formed at the side portion of the base region as described above.

Meanwhile, Japanese Patent Laying-Open No. 03-029328 (Patent Document 4) discloses, as a technique to lower a feedback capacitance, a Schottky-junction field effect transistor that has a protection film of a thickness smaller in an active region than in an inactive region.

According to Patent Documents 1 to 3 above, though an ON voltage is lowered by the high-concentration impurity region formed at the side portion of the base region, it is difficult to achieve operation at higher speed, as will be described below.

In order to achieve operation at higher speed, it is necessary to lower a feedback capacitance. Here, the feedback capacitance refers to the sum of an insulating film capacitance produced between a gate electrode and a base region with an insulating film being interposed and a depletion capacitance produced in a region where a depletion layer extends at a pn junction between the base region and a region at the side portion thereof. In Patent Documents 1 to 3 above, as the high-concentration region provided at the side portion of the base region contains a large amount of carrier, extension of the depletion layer from the pn junction between the base region and the high-concentration region to the high-concentration region is restricted. Accordingly, if the high-concentration region extends over the entire side portion of the base region in Patent Documents 1 to 3, extension of the depletion layer is restricted along the entire side portion of the base region, and consequently the depletion capacitance increases in the high-concentration region and hence the feedback capacitance increases. Therefore, operation at higher speed cannot be achieved due to the increase in the feedback capacitance.

According to Patent Document 4 above, the feedback capacitance can be lowered by lowering the insulating film capacitance. A technique to lower an ON voltage in a region where a channel is formed, however, is not disclosed, and the ON voltage is disadvantageously high.

SUMMARY OF THE INVENTION

From the foregoing, an object of the present invention is to provide a semiconductor device maintaining a low ON voltage and achieving operation at higher speed by lowering a feedback capacitance.

A semiconductor device according to the present invention includes a semiconductor substrate having a main surface and a semiconductor element having an insulated gate field effect portion formed in the semiconductor substrate. The semiconductor element includes a first region, a source region, a base region, a second region, an insulating film, and a gate electrode. The first region is formed in the main surface and has a first conductivity type. The source region is formed in the main surface and has the first conductivity type. The base region is formed in the main surface adjacent to the source region and has a second conductivity type. The second region is formed in the main surface adjacent to the base region and opposed to the source region with the base region being interposed, has an impurity concentration higher than that of the first region, and has the first conductivity type. The insulating film is formed on the base region located between the source region and the second region. The gate electrode is formed on the insulating film. The first region is formed in the main surface adjacent to the base region and to the second region.

According to the semiconductor device of the present invention, the second region relatively higher in impurity concentration and the first region relatively lower in impurity concentration are formed at the side portion of the base region. As the second region is higher in impurity concentration than the first region, extension of the depletion layer from the pn junction between the base region and the second region to the second region can be suppressed. Accordingly, by arranging the second region at the side portion of the base region opposed to the source region, a distance for inverting the conductivity type of carrier can be made smaller in a channel formed between the source region and the second region. Therefore, as a voltage applied to the gate electrode for forming a channel can be lowered, a low ON voltage can be maintained.

In addition, as the first region has an impurity concentration lower than the second region, extension of the depletion layer from the pn junction between the base region and the first region to the first region becomes greater than in the second region. Therefore, by arranging the first region at the side portion of the base region other than a position opposed to the source region, a depletion capacitance and hence a feedback capacitance can be lowered. Thus, operation at higher speed can be achieved.

From the foregoing, lower ON voltage and operation at higher speed can both be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described hereinafter with reference to the drawings.

First Embodiment

Figure 1:
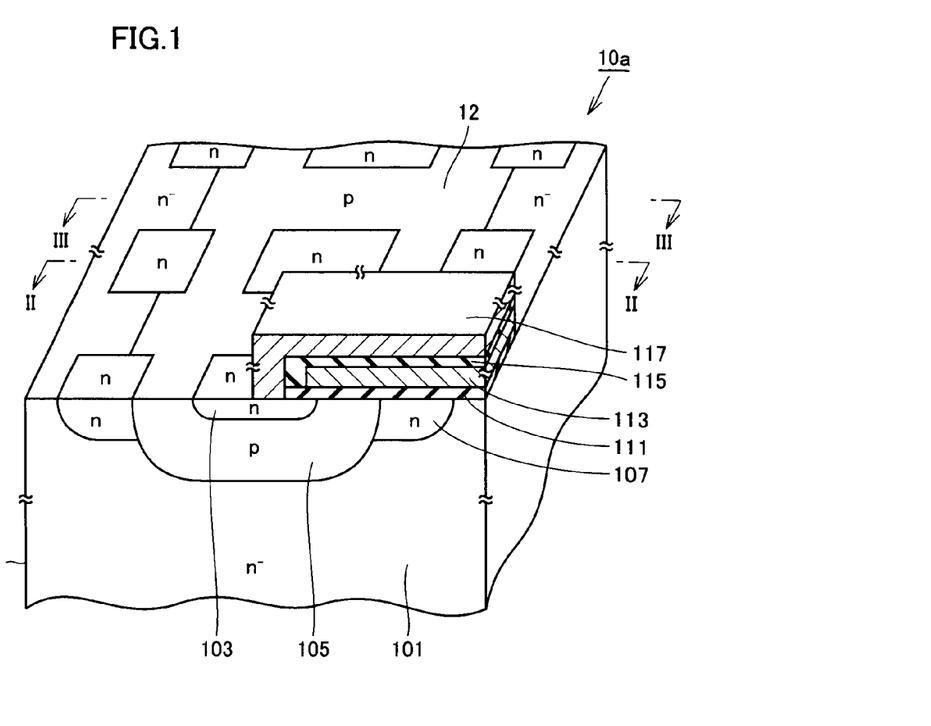
FIG. 1 is a schematic perspective view showing a configuration of a semiconductor device in a first embodiment of the present invention.

As shown in FIG. 1, a semiconductor device 10a according to the present embodiment includes a semiconductor substrate 11 having a main surface 12 and a semiconductor element having an insulated gate field effect portion formed in semiconductor substrate 11. The semiconductor element may be implemented, for example, by an IGBT, a MISFET and the like, and may be vertical or lateral. For example, a silicon substrate or the like may be employed as semiconductor substrate 11. It is noted that only a part of an insulating film 111, a gate electrode 113, an interlayer insulating film 115, an emitter electrode 117, and the like is illustrated in FIG. 1.

Figure 2:
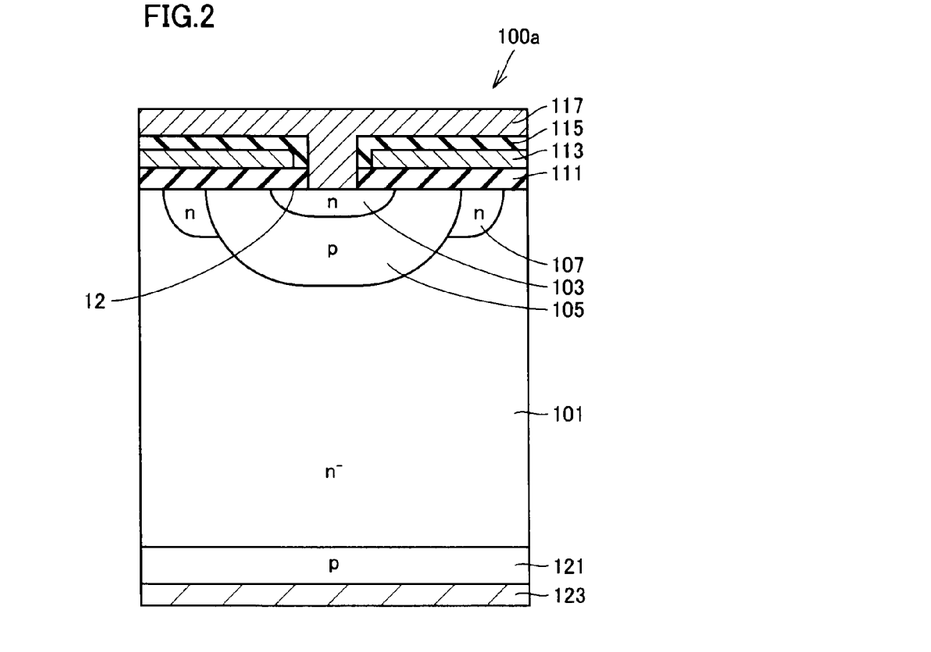
FIG. 2 is a cross-sectional view along the line II-II in FIG. 1.
Figure 3:
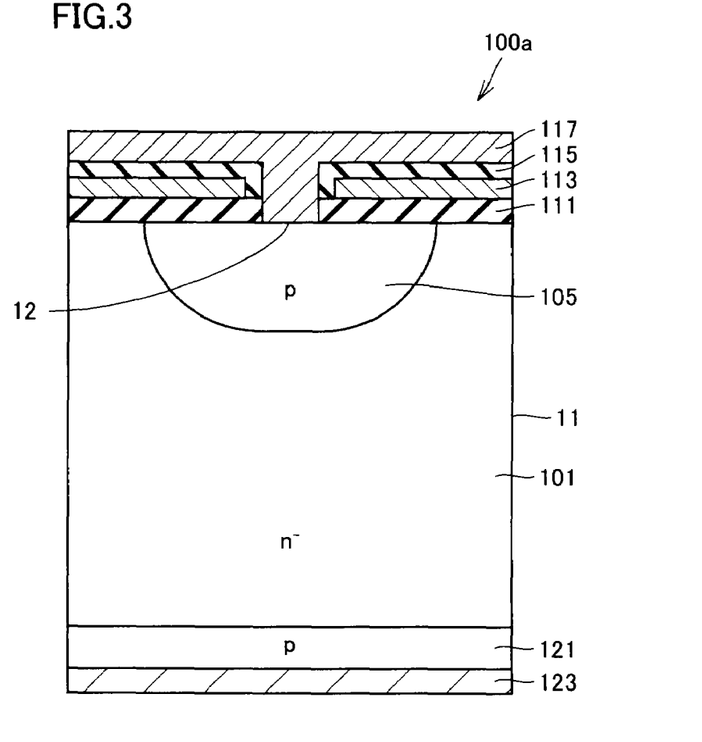
FIG. 3 is a cross-sectional view along the line III-III in FIG. 1.
Figure 4:
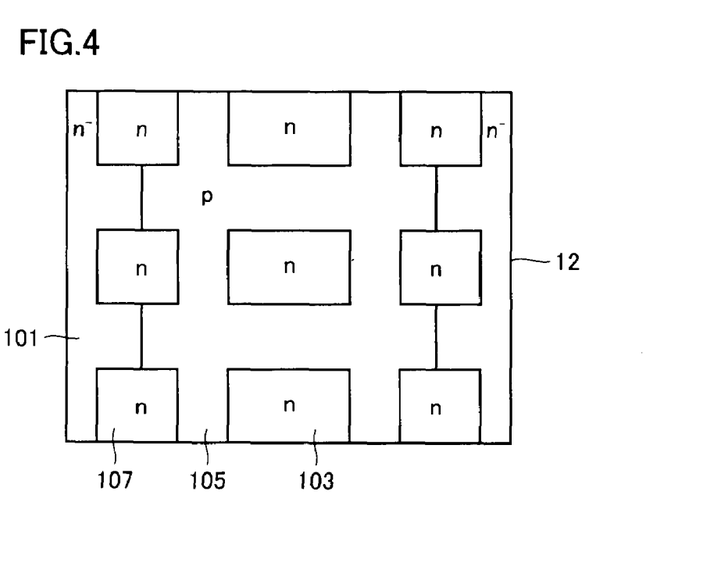
FIG. 4 is a plan view showing distribution of a p-type region and an n-type region in a surface of a semiconductor substrate in the first embodiment of the present invention.

A specific configuration when the configuration shown in FIG. 1 is applied to a vertical IGBT will now be described. FIGS. 2 to 4 are diagrams showing a specific configuration when the configuration shown in FIG. 1 is applied to the vertical IGBT. FIGS. 2 and 3 are cross-sectional views along the lines II-II and III-III in FIG. 1, respectively. FIG. 4 is a plan view showing distribution of a p-type region and an n-type region in a surface of the semiconductor substrate.

As shown in FIGS. 2 to 4, a semiconductor element 100a in the present embodiment is implemented by a vertical IGBT and mainly includes an n$^-$ region (first region) 101, an n-type source region 103, a p-type base region 105, an n region (second region) 107, insulating film 111, gate electrode 113, and a p-type collector region 121.

N$^-$ region 101 is formed in semiconductor substrate 11 and located in a part of main surface 12 of semiconductor substrate 11. P-type base region 105 is located in a part of main surface 12 of semiconductor substrate 11 to form a pn junction with n$^-$ region 101. N-type source region 103 is located in a part of main surface 12 within p-type base region 105, so as to form a pn junction with p-type base region 105. N region 107 is formed at a side portion of p-type base region 105 in main surface 12, so as to form a pn junction with p-type base region 105.

Insulating film 111 serves to insulate semiconductor substrate 11 from gate electrode 113, and it is formed at least on the surface of p-type base region 105 lying between n-type source region 103 and n region 107. Gate electrode 113 is formed on insulating film 111, to be opposed at least to p-type base region 105 lying between n-type source region 103 and n region 107.

P-type collector region 121 is formed on a surface opposite to main surface 12 of semiconductor substrate 11 and forms a pn junction with n$^-$ region 101.

Emitter electrode 117 is formed on main surface 12 for electric connection with n-type source region 103. Emitter electrode 117 is electrically insulated from gate electrode 113 by interlayer insulating film 115. In addition, a collector electrode 123 is formed on a surface opposite to main surface 12 for electrical connection with p-type collector region 121.

Distribution of an n-type region and a p-type region in main surface 12 of semiconductor substrate 11 in the present embodiment will now be described in detail.

As shown in FIGS. 1, 2, and 4, in main surface 12 of semiconductor substrate 11, n region 107 is formed at a position opposed to n-type source region 103, with p-type base region 105 being interposed. In the present embodiment, two n regions 107 are formed adjacent to respective opposing sides of p-type base region 105.

As shown in FIGS. 1, 3, and 4, in main surface 12 of semiconductor substrate 11, n$^-$ region 101 is formed at the side portion of p-type base region 105 other than the position opposed to n-type source region 103. In the present embodiment, n$^-$ region 101 is formed at opposing side portions of p-type base region 105, other than the position opposed to n-type source region 103. N$^-$ region 101 is adjacent to p-type base region 105 and to n region 107.

As shown in FIGS. 1 and 4, a plurality of n-type source regions 103 are formed in p-type base region 105. In main surface 12, p-type base region 105 surrounds n-type source regions 103, while it is adjacent to n-type source regions 103. Each of the plurality of n-type source regions 103 is arranged in a longitudinal direction of p-type base region 105. P-type base region 105 lies between each pair of n-type source regions 103, so that the plurality of n-type source regions 103 are electrically isolated from each other.

N regions 107 are arranged on respective opposing sides of each of the plurality of n-type source regions 103, with p-type base region 105 being interposed as described above (on respective opposing sides of p-type base region 105 in a direction perpendicular to the longitudinal direction). In addition, as described above, n⁻ region 101 is arranged on opposing sides of p-type base region 105 lying between adjacent n-type source regions 103, in such a manner that p-type base region 105 lies therein (on opposing sides of p-type base region 105 in a lateral direction). Thus, at the side portion of p-type base region 105, n⁻ region 101 and n region 107 are alternately arranged in a longitudinal direction of p-type base region 105.

In addition, the shortest distance in main surface 12 from n-type source region 103 to n region 107 is shorter than the shortest distance in main surface 12 from n-type source region 103 to n⁻ region 101.

It is noted that gate electrode 113 may be formed over another region, so long as it is formed to oppose to p-type base region 105 (one region) located between n-type source region 103 and n region 107.

Meanwhile, insulating film 111 is implemented, for example, by a silicon oxide film such as a polycrystalline silicon film doped with an impurity.

In addition, n⁻ region 101 is of a first conductivity type (n) and has an impurity concentration lower than n-type source region 103 (for example, $1\times10^{13}$ cm$^{-3}$ to $1\times10^{14}$ cm$^{-3}$). N region 107 has an impurity concentration higher than n⁻ region 101 (for example, $1\times10^{15}$ cm$^{-3}$ to $1\times10^{17}$ cm$^{-3}$), and it is of the first conductivity type as in n⁻ region 101 and n-type source region 103.

Here, difference in the impurity concentration between n⁻ region 101 and n region 107, and n-type source region 103 is not particularly limited, and the impurity concentration of n-type source region 103 is higher than the impurity concentration of n region 107 and n⁻ region 101. For example, P (phosphorus), As (arsenic), and the like may be used as the n-type impurity.

In addition, p-type base region 105 is of a second conductivity type (p) different from n⁻ region 101. For example, B (boron) and the like may be used as the p-type impurity.

Though the first and second conductivity types are determined so as to form an n channel in the present embodiment as will be described later, the first and second conductivity types may be reversed so as to form a p channel.

A method of manufacturing semiconductor device 10a in the present embodiment will now be described with reference to FIGS. 1 to 5.

As shown in FIG. 1, initially, semiconductor substrate 11 having n⁻ region 101 is prepared. N region 107 is selectively formed in the surface of n⁻ region 101, for example, by ion implantation. P-type base region 105 is formed on an inner side of n region 107, for example, by ion implantation. Diffusion of p-type base region 105 in a lateral direction beyond a desired extent can thus be prevented. N-type source region 103 is formed in the surface within p-type base region 105, for example, by ion implantation.

Thereafter, insulating film 111, gate electrode 113, interlayer insulating film 115, and emitter electrode 117 are successively formed.

Thereafter, p-type collector region 121 is formed on the side opposite to where n-type source region 103 is formed in n⁻ region 101, for example, by ion implantation. Collector electrode 123 is formed to be in contact with p-type collector region 121. Semiconductor device 10a including the vertical IGBT serving as semiconductor element 100a shown in FIGS. 1 to 4 is thus manufactured.

An operation of semiconductor element 100a configuring semiconductor device 10a in the present embodiment will be described next.

Initially, turn-on in which semiconductor element 100a makes transition from an OFF state to an ON state will be described. When a relatively positive voltage is applied to gate electrode 113 in semiconductor element 100a, an n channel, which is an inversion layer, is formed in the surface of p-type base region 105 under gate electrode 113. Then, electrons serving as n-type carrier are injected from n-type source region 103 through the channel into n⁻ region 101, and flow toward p-type collector region 121 to which a relatively positive voltage is applied. When the electrons reach p-type collector region 121, holes serving as another carrier flow from p-type collector region 121 toward n⁻ region 101, and further toward n-type source region 103 to which a relatively negative voltage is applied.

Thereafter, sufficient carriers are accumulated in n⁻ region 101 from emitter electrode 117 and collector electrode 123 in accordance with a difference in potential applied across the electrodes. Thus, a low resistance state called conductivity modulation appears as a result of a pair of electron and hole, and turn-on is completed.

A steady state after completion of the turn-on is the ON state. In the ON state, as electrons serving as carrier pass through n region 107 having impurity concentration higher than n⁻ region 101, ON resistance can be lowered. In addition, a depletion layer extending from the pn junction at an interface between n region 107 and p-type base region 105 to n region 107 has a width smaller than a depletion layer extending from the pn junction between n⁻ region 101 and p-type base region 105 to n⁻ region 101. Therefore, in the ON state, as length of the channel (n channel in the present embodiment) can be shorter, the ON resistance can be lowered. In the ON state, efficiency in injecting electrons can thus be improved by n region 107.

Turn-off where semiconductor element 100a makes transition from the ON state to the OFF state will be described next. When a relatively negative voltage is applied to gate electrode 113, the n channel formed at the side portion of gate electrode 113 disappears and supply of electrons from n-type source region 103 to p-type base region 105 is stopped.

With the decrease in density of electrons, concentration of electrons that have been injected into n⁻ region 101 starts to gradually decrease. Holes that have been injected into n⁻ region 101 in order to maintain charge neutrality also start to decrease and a depletion layer starts to extend at the interface between p-type base region 105 and n⁻ region 101, whereby the depletion layer has a thickness in accordance with a voltage applied across the electrodes in the OFF state.

Holes in an electrically neutral region in n⁻ region 101 where electrons and holes serving as carriers remain except for the depletion layer pass through the depletion layer and further pass through n-type source region 103 to emitter electrode 117, and all carriers disappear. Turn-off is thus completed. A steady state after the turn-off is the OFF state.

The OFF state can be established by applying a relatively negative voltage to gate electrode 113, even if a forward bias is kept applied across emitter electrode 117 and collector electrode 123.

As described above, in switching semiconductor element 100a, turn-on for making transition from the OFF state to the ON state and turn-off for making transition from the ON state to the OFF state are necessary. A switching speed in switching between the ON state and the OFF state depends on a rate of accumulating carrier in or releasing carrier from n⁻ region 101. A parasitic capacitance representing a capacitance of the carrier accumulated in or released from n⁻ region 101 is the total of the feedback capacitance until a voltage across the gate and the collector (drain) is turned on or off (gate-collector capacitance). If the feedback capacitance is great, the switching speed becomes slower. Therefore, by lowering the feedback capacitance, the switching speed can be improved and consequently operation at higher speed of semiconductor device 10a can be achieved. Namely, a smaller feedback capacitance is more advantageous for achieving operation at higher speed of semiconductor device 10a.

Figure 5:
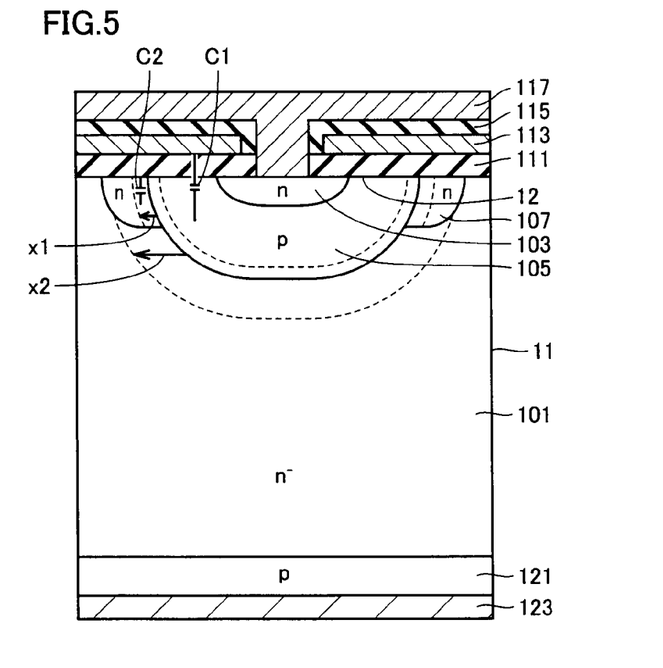
FIG. 5 is a cross-sectional view showing an operation in a region where a channel is formed, of a semiconductor element configuring the semiconductor device in the first embodiment of the present invention.
Figure 6:
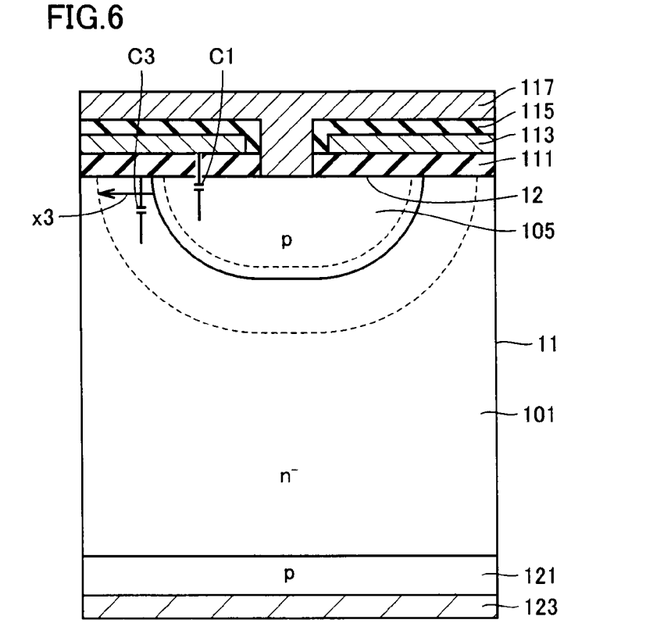
FIG. 6 is a cross-sectional view showing an operation in a region where a channel is not formed, of a semiconductor element configuring the semiconductor device in the first embodiment of the present invention.

As shown in FIGS. 5 and 6, the feedback capacitance here is the sum of insulating film capacitance C1 produced between gate electrode 113 and p-type base region 105 with insulating film 111 being interposed and depletion capacitance C2, C3 produced in a region where the depletion layer extends at the pn junction between p-type base region 105 and a region at the side portion thereof. It is noted that a dotted line in FIGS. 5 and 6 represents the depletion layer at the pn junction.

A feedback capacitance of semiconductor element 100a in the present embodiment will now be described with reference to FIGS. 5 and 6.

As shown in FIG. 5, a region in semiconductor element 100a opposed to n-type source region 103 is the active region where a channel is formed during an ON operation (region contributing to the ON operation). In this region, a width ×1 of the depletion layer extending from the pn junction between p-type base region 105 and n region 107 to n region 107 is smaller than a width ×2 of the depletion layer extending from the pn junction between p-type base region 105 and n⁻ region 101 to n⁻ region 101.

As shown in FIG. 6, a region in semiconductor element 100a other than the region opposed to n-type source region 103 is the inactive region where a channel is not formed during the ON operation (region not contributing to the ON operation). In this region, n region 107 is not formed at the side portion of p-type base region 105. Namely, n⁻ region 101 is arranged in the region other than the position opposed to n-type source region 103. Therefore, a width ×3 of the depletion layer in the inactive region (region not contributing to the ON operation) other than the position opposed to n-type source region 103 shown in FIG. 6 is greater than width ×1 of the depletion layer in the active region shown in FIG. 5. Namely, in the inactive region, extension of the depletion layer at the pn junction is greater. Therefore, depletion capacitance C3 in the inactive region is smaller than depletion capacitance C2 in the active region.

Next, the feedback capacitance in semiconductor element 100a in the present embodiment and the feedback capacitance in the semiconductor element in Patent Documents 1 to 3 (conventional example) will be compared with each other. The high-concentration region in Patent Documents 1 to 3 above corresponds to n region (second region) 107 in the present embodiment. If the high-concentration region extends over the entire side portion of the p-type base region in Patent Documents 1 to 3 above, a semiconductor element according to the conventional example as shown in FIGS. 14 and 15 is obtained.

Figure 14:
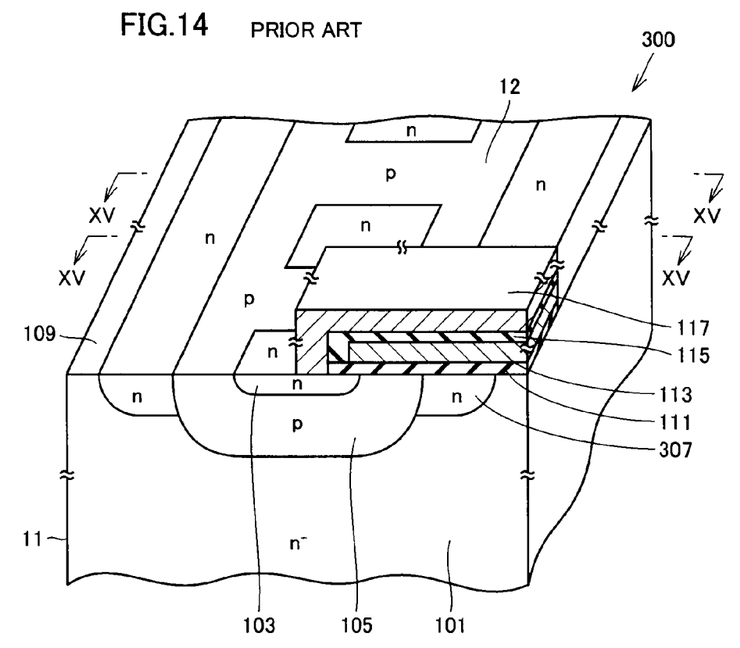
FIG. 14 is a schematic perspective view showing a configuration of a semiconductor device when a high-concentration region extends over an entire side portion of a p-type base region in Patent Documents 1 to 3.

As shown in FIG. 14, in a semiconductor element 300 according to the conventional example, an n region 307 is formed at the side portion of p-type base region 105 in both of the active region where a channel is formed and the inactive region where a channel is not formed.

Figure 15:
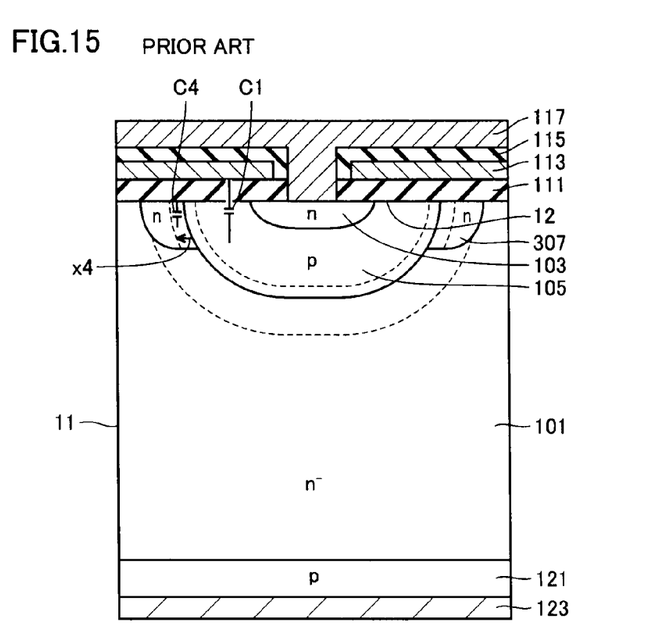
FIG. 15 is a cross-sectional view along the line XV-XV in FIG. 14.

Comparing the active region in semiconductor element 100a in the present embodiment shown in FIG. 5 with the active region in semiconductor element 300 according to the conventional example shown in FIG. 15, widths ×1 and ×4 of the depletion layers extending from the pn junction between p-type base region 105 and n regions 107 and 307 to n regions 107 and 307 respectively are equal to each other.

Comparing the inactive region in semiconductor element 100a in the present embodiment shown in FIG. 6 with the inactive region according to the conventional example shown in FIG. 15, however, width ×3 of the depletion layer extending from the pn junction between n⁻ region 101 and p-type base region 105 to n⁻ region 101 in the inactive region in the present embodiment is greater than width ×4 of the depletion layer extending from the pn junction between n⁻ region 101 and n region 307 to n region 307 in the inactive region in the conventional example. Namely, difference between width ×3 of the depletion layer in the inactive region in the present embodiment shown in FIG. 6 and width ×4 of the depletion layer in the inactive region shown in FIG. 15 represents increase in width of the depletion layer in semiconductor device 10a in the present embodiment, as compared with the conventional example. Accordingly, depletion capacitance C3 in the inactive region in the present embodiment is smaller than depletion capacitance C4 in the inactive region in the conventional example. Therefore, as semiconductor element 100a in the present embodiment can achieve lower depletion capacitance C3 in the inactive region than in the conventional example, the feedback capacitance can be lowered.

As described above, semiconductor device 10a according to the present embodiment includes semiconductor substrate 11 having main surface 12 and semiconductor element 100a having the insulated gate field effect portion formed in semiconductor substrate 11. Semiconductor element 100a includes n⁻ region 101 serving as the first region, n-type source region 103, p-type base region 105, n region 107, insulating film 111, and gate electrode 113. N⁻ region 101 having the first conductivity type is formed in main surface 12. N-type source region 103 having the first conductivity type is formed in main surface 12. P-type base region 105 having the second conductivity type is formed in main surface 12 adjacent to n-type source region 103. N region 107 having the first conductivity type is formed in main surface 12 adjacent to p-type base region 105 and opposed to n-type source region 103 with p-type base region 105 being interposed, and has an impurity concentration higher than n⁻ region 101. Insulating film 111 is formed on p-type base region 105 located between n-type source region 103 and n region 107. Gate electrode 113 is formed on insulating film 111. N⁻ region 101 serving as the first region is formed adjacent to p-type base region 105 and to n region 107.

According to semiconductor device 10a in the present embodiment, n region 107 having a relatively high impurity concentration and n⁻ region 101 having a relatively low impurity concentration are formed at the side portion of p-type base region 105. As n region 107 has an impurity concentration higher than n⁻ region 101, extension of the depletion layer from the pn junction between p-type base region 105 and n region 107 to n region 107 is smaller than extension of the depletion layer from the pn junction between p-type base region 105 and n⁻ region 101 to n⁻ region 101. Accordingly, by arranging n region 107 at the side portion of p-type base region 105 opposed to n-type source region 103, extension of the depletion layer is suppressed and a JFET effect can be reduced, thus maintaining a low ON voltage.

In addition, by forming p-type base region 105 after formation of n region 107 having impurity concentration higher than n⁻ region 101, diffusion of the impurity of the second conductivity type in p-type base region 105 into n region 107 beyond a prescribed extent can be suppressed in forming p-type base region 105. Namely, a channel can be prevented from becoming longer (short channel effect). Therefore, as the channel resistance can be lowered, low ON voltage can be maintained.

In addition, as n⁻ region 101 has impurity concentration lower than n region 107, width ×3 of the depletion layer from the pn junction between p-type base region 105 and n⁻ region 101 to n⁻ region 101 is greater than width ×1 of the depletion layer from the pn junction between p-type base region 105 and n region 107 to n region 107. Accordingly, by arranging n⁻ region 101 at the side portion of p-type base region 105 other than the position opposed to n-type source region 103, depletion capacitance C3 is lowered and hence the feedback capacitance can be lowered. Therefore, operation at higher speed can be achieved.

Stating the above features otherwise, as n region 107 having a relatively high impurity concentration is formed at the side portion of a region in p-type base region 105 opposed to n-type source region 103 (that is, a region where the channel is formed), the low ON voltage can be maintained. As n⁻ region 101 having a relatively low impurity concentration is formed at the side portion of a region in p-type base region 105 other than the region opposed to n-type source region 103 (that is, a region where the channel is not formed), operation at higher speed can be achieved without affecting lowering in the ON resistance, as a result of lowering in the feedback capacitance by reduction in depletion capacitance C3. Lower ON voltage and operation at higher speed can thus both be achieved.

Moreover, as carriers pass through n region 107 having impurity concentration higher than n⁻ region 101 in the ON state, the low ON resistance can be maintained.

In semiconductor device 10a above, preferably, gate electrode 113 is formed to extend over another region of p-type base region 105 other than one region of p-type base region 105 located between n-type source region 103 and n region 107.

Thus, even if gate electrode 113 is formed over the region where the channel is not formed, the feedback capacitance can be lowered by lowering depletion capacitance C3.

In semiconductor device 10a above, preferably, semiconductor element 100a is implemented by an IGBT and further has p-type collector region 121 of the second conductivity type.

Semiconductor device 10a including an IGBT capable of maintaining a low ON voltage and achieving operation at higher speed by lowering a feedback capacitance can thus be implemented.

Second Embodiment

Figure 7:
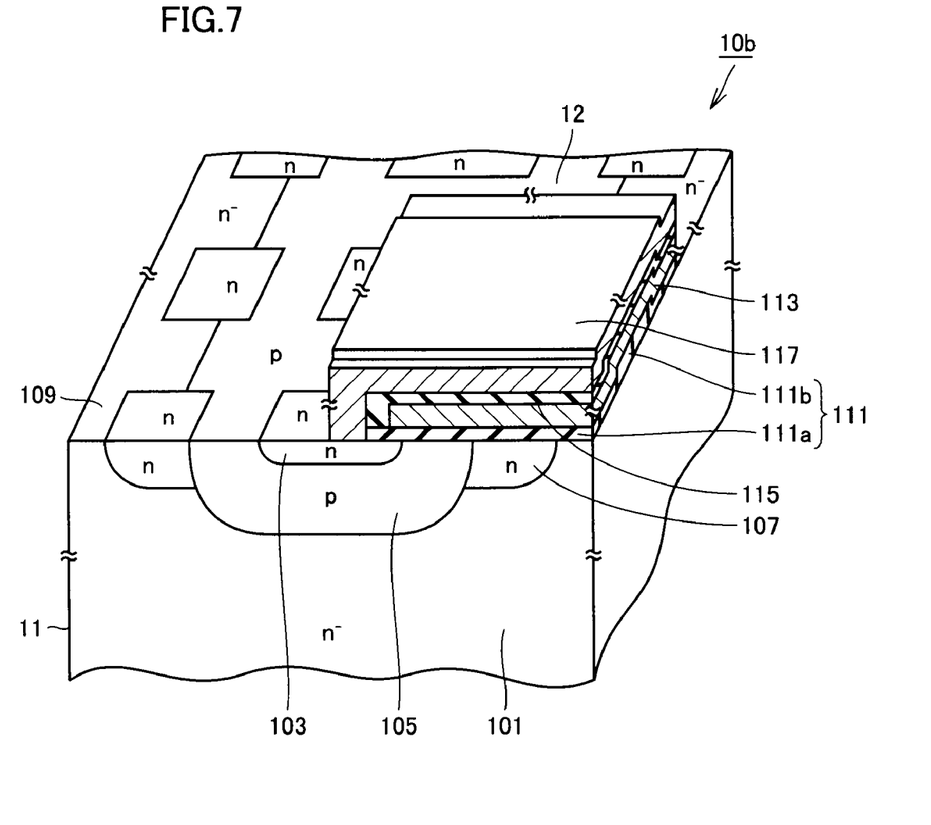
FIG. 7 is a schematic perspective view showing a configuration of a semiconductor device in a second embodiment of the present invention.

Referring to FIG. 7, a semiconductor device in the present embodiment is basically configured similarly to semiconductor device 10a shown in FIG. 1, however, it is different in an insulating film of a semiconductor element configuring a semiconductor device 10b.

Specifically, as shown in FIG. 7, insulating film 111 is formed to extend over another region of p-type base region 105 other than one region of p-type base region 105 located between n-type source region 103 and n region 107. Namely, insulating film 111 includes an insulating film 111a formed on p-type base region 105 where a channel is formed and an insulating film 111b formed on another region of p-type base region 105 where a channel is not formed. It is noted that insulating film 111 may be formed on yet another region, for example, on n region 107 and the like.

Insulating film 111b formed on another region of p-type base region 105 is larger in thickness than insulating film 111a formed on one region of p-type base region 105.

As the configuration is otherwise substantially the same as in the first embodiment described above, the same elements have the same reference characters allotted and description thereof will not be repeated.

As described above, according to semiconductor device 10b in the present embodiment, insulating film 111b formed on another region of p-type base region 105 is larger in thickness than insulating film 111a formed on one region of p-type base region 105.

Thus, as the thickness of insulating film 111b formed on p-type base region 105 where a channel is not formed can be made larger, the feedback capacitance can further be lowered by lowering insulating film capacitance C1. In addition, as gate electrode 113 above p-type base region 105 where a channel is formed does not contribute to an operation performed when a forward bias is applied, increase in Vth (threshold voltage), lowering in the ON voltage, or the like is not affected.

Third Embodiment

Figure 8:
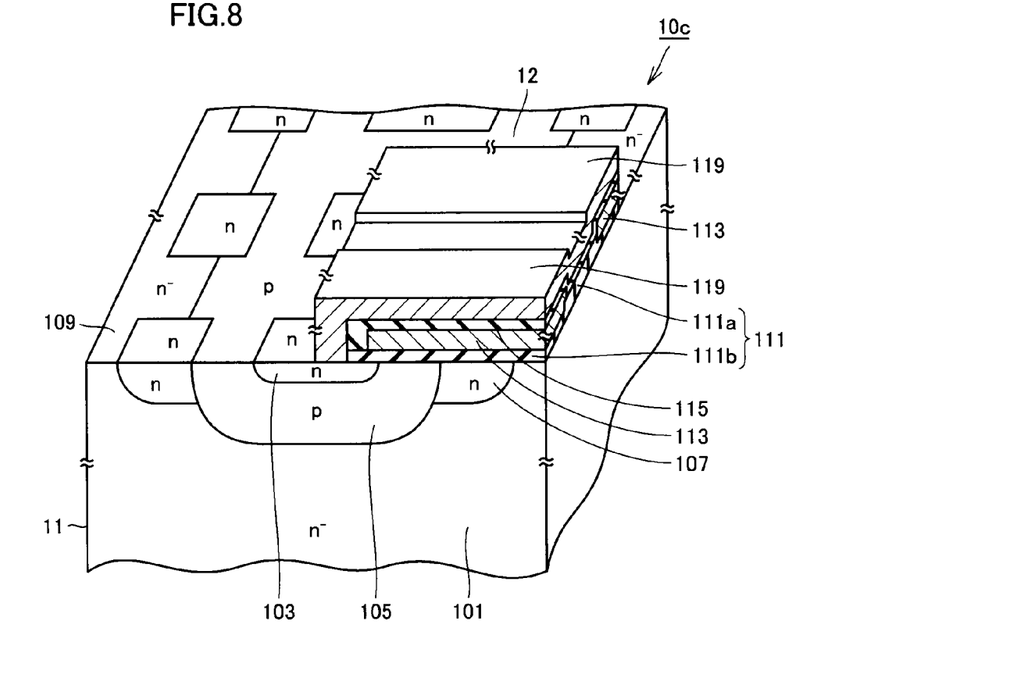
FIG. 8 is a schematic perspective view showing a configuration of a semiconductor device in a third embodiment of the present invention.

Referring to FIG. 8, a semiconductor device in the present embodiment is basically configured similarly to semiconductor device 10a shown in FIG. 1, however, it is different in a gate electrode of a semiconductor element configuring a semiconductor device 10c.

Specifically, as shown in FIG. 8, gate electrode 113 is formed only above p-type base region 105 located between n-type source region 103 and n region 107. Insulating film 111a is provided on p-type base region 105 where a channel is not formed and on n⁻ region 101, in a manner in contact with the same.

As the configuration is otherwise substantially the same as in the first embodiment described above, the same elements have the same reference characters allotted and description thereof will not be repeated.

As described above, according to semiconductor device 10c in the present embodiment, gate electrode 113 is formed only above p-type base region 105 located between n-type source region 103 and n region 107.

Thus, as the voltage applied from gate electrode 113 can theoretically be set to 0, the feedback capacitance can significantly be lowered by significantly lowering insulating film capacitance C1. In addition, as gate electrode 113 is provided above p-type base region 105 where a channel is not formed, gate electrode 113 does not contribute to an operation performed when a forward bias is applied, and hence increase in Vth (threshold voltage), lowering in the ON voltage, or the like is not affected.

Though FIG. 1 showing the first embodiment, FIG. 7 showing the second embodiment, and FIG. 8 showing the third embodiment above have illustrated a vertical IGBT as an example of a semiconductor element configuring a semiconductor device, FIGS. 1, 7, and 8 are also applicable, for example, to a vertical MOSFET, a lateral IGBT, a lateral MOSFET, and the like which will be described later.

Fourth Embodiment

Figure 9:
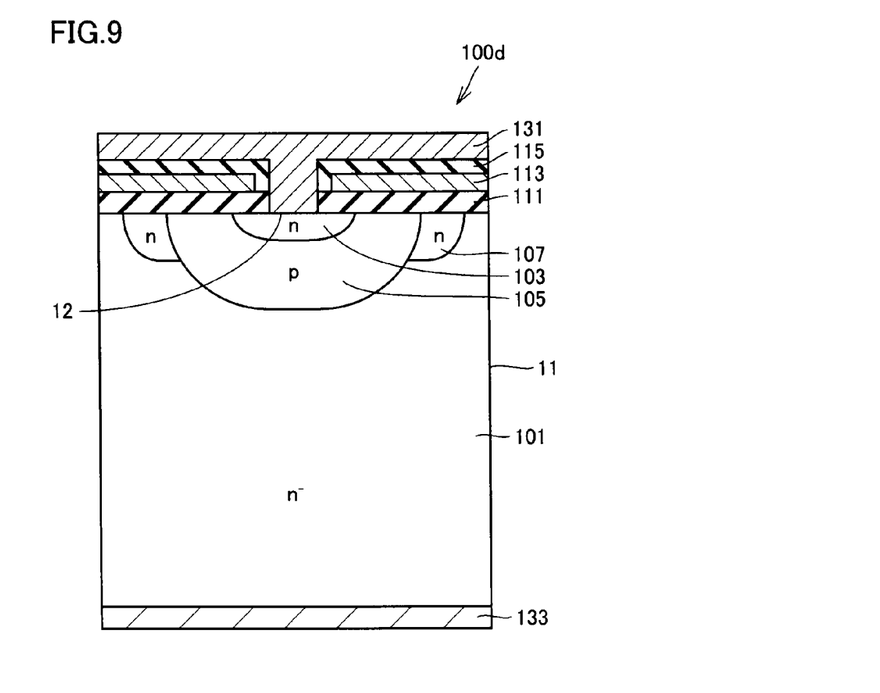
FIG. 9 is a cross-sectional view in a region where a channel is formed, showing a semiconductor element configuring a semiconductor device in a fourth embodiment of the present invention.

Referring to FIG. 9, a semiconductor device in the present embodiment is basically configured similarly to the semiconductor device shown in FIGS. 2 and 3, however, it is different in that a semiconductor element 100d is implemented by a MISFET (Metal-Insulator-Semiconductor Field Effect Transistor).

Semiconductor element 100d in the present embodiment is implemented by a vertical MOSFET representing a MISFET. Specifically, as shown in FIG. 9, in semiconductor element 100d, a collector region and a collector electrode are not formed but a drain electrode 133 is formed on a surface opposite to a surface where n-type source region 103 is formed in n⁻ region 101. In addition, a source electrode 131 is formed on main surface 12 of n-type source region 103, instead of the emitter electrode.

In semiconductor element 100d, n region 107 is not formed in a region other than the region opposed to n-type source region 103, as in the first embodiment. In addition, distribution of the p-type region and the n-type region in main surface 12 of semiconductor substrate 11 is as shown in FIG. 4.

Though a method of manufacturing the semiconductor device in the present embodiment is basically the same as the method of manufacturing semiconductor device 10a in the first embodiment, it is different in that source electrode 131 is formed instead of the emitter electrode, ion implantation for forming a p-type collector region is not performed, and drain electrode 133 is formed instead of the collector electrode, in forming semiconductor element 100d.

An operation of semiconductor element 100d configuring the semiconductor device in the present embodiment is basically the same as that of the IGBT serving as semiconductor element 100a in the first embodiment, except that only electrons serve as carrier.

As the configuration is otherwise substantially the same as in the first embodiment described above, the same elements have the same reference characters allotted and description thereof will not be repeated.

As described above, according to the semiconductor device in the present embodiment, semiconductor element 100d is implemented by a MISFET. A semiconductor device including a MISFET capable of maintaining a low ON voltage and achieving operation at higher speed by lowering a feedback capacitance can thus be implemented.

Fifth Embodiment

Figure 10:
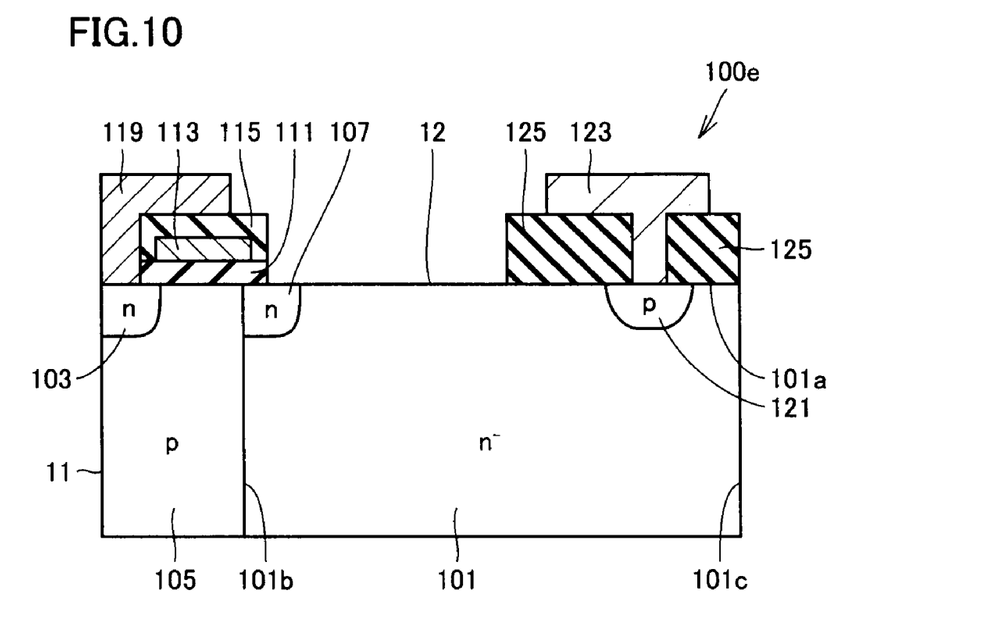
FIG. 10 is a cross-sectional view in a region where an n-type source region and an n region are opposed to each other (a region where a channel is formed), showing a semiconductor element configuring a semiconductor device in a fifth embodiment of the present invention.
Figure 11:
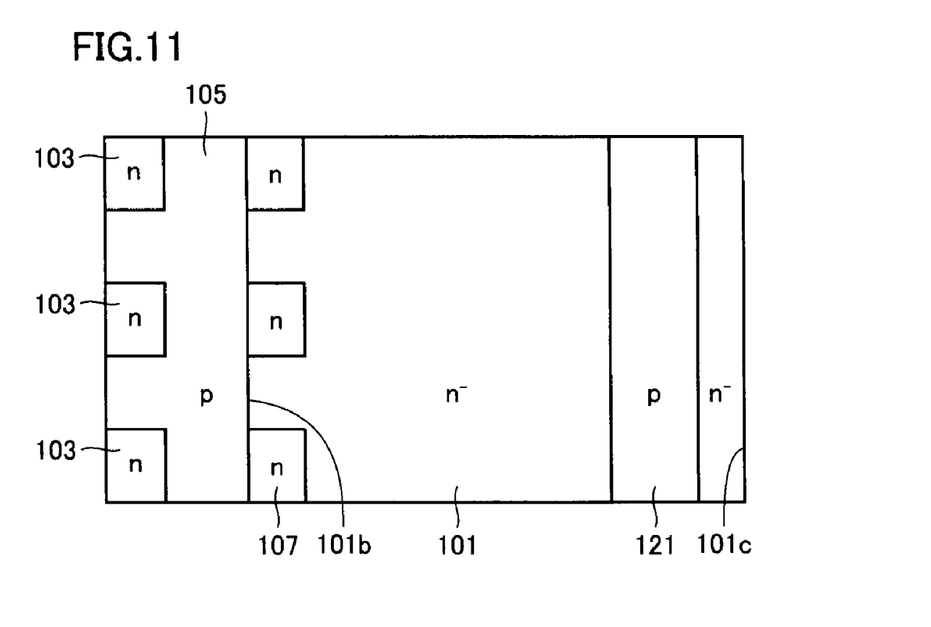
FIG. 11 is a plan view showing distribution of a p-type region and an n-type region in a surface of a semiconductor substrate in the fifth embodiment of the present invention.

Referring to FIGS. 10 and 11, a semiconductor device in the present embodiment is basically configured similarly to the semiconductor device in the first embodiment, however, it is different in that a semiconductor element 100e is implemented by a lateral IGBT.

Specifically, as shown in FIG. 10, n⁻ region 101 is formed in main surface 12 of semiconductor substrate 11 and has a main surface 101a, one side surface 101b, and another side surface 101c. In addition, as shown in FIG. 11, n region 101 is formed on the side of one side surface 101b of n⁻ region 101 and adjacent to n region 107. P-type collector region 121 is formed in main surface 101a on the side of another side surface 101c of n⁻ region 101. Collector electrode 123 is provided on p-type collector region 121 in a manner in contact with the same and provided on main surface 101a of n⁻ region 101 with an insulating film 125 being interposed.

P-type base region 105 is formed adjacent to one side surface 101b of n⁻ region 101 and to n-type source region 103. N-type source region 103 is formed in main surface 12 and a plurality of n-type source regions 103 are formed in p-type base region 105, on a side opposite to the side adjacent to one side surface 101b of n⁻ region 101. A plurality of n regions 107 are formed on the side of one side surface 101b of n⁻ region 101, adjacent to p-type base region 105 and opposed to n-type source region 103 with p-type base region 105 being interposed.

Though a method of manufacturing the semiconductor device in the present embodiment is basically the same as the method of manufacturing semiconductor device 10a in the first embodiment, it is different in forming n-type source region 103 and p-type base region 105 on the side of one side surface 101b of n⁻ region 101 and in forming p-type collector region 121, collector electrode 123, and insulating film 125 in main surface 101a on the side of another side surface 101c of n⁻ region 101.

As the configuration is otherwise substantially the same as in the first embodiment described above, the same elements have the same reference characters allotted and description thereof will not be repeated.

As described above, according to the semiconductor device in the present embodiment, a lateral IGBT is included as semiconductor element 100e. A semiconductor device including a lateral IGBT capable of maintaining a low ON voltage and achieving operation at higher speed by lowering a feedback capacitance can thus be implemented.

Sixth Embodiment

Figure 12:
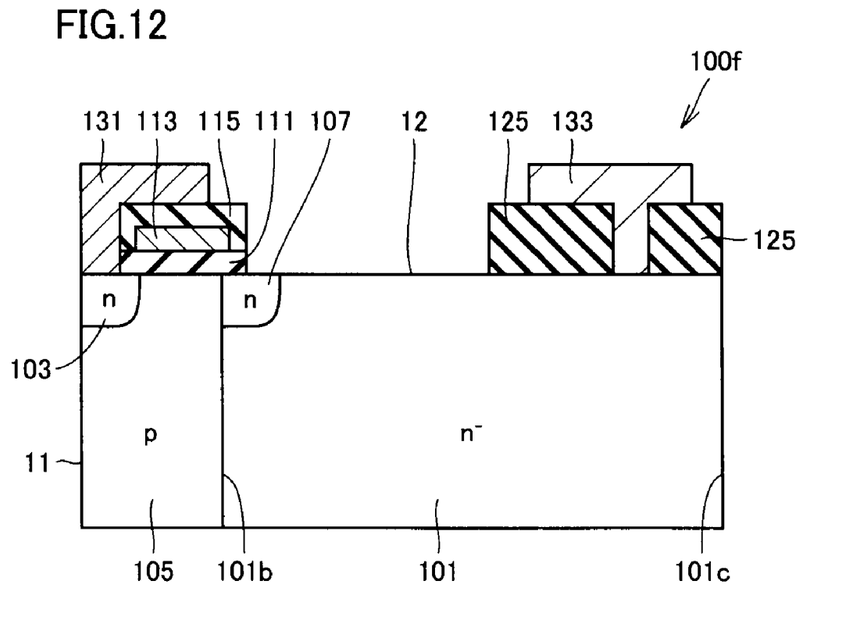
FIG. 12 is a cross-sectional view in a region where an n-type source region and an n region are opposed to each other (a region where a channel is formed), showing a semiconductor element configuring a semiconductor device in a sixth embodiment of the present invention.
Figure 13:
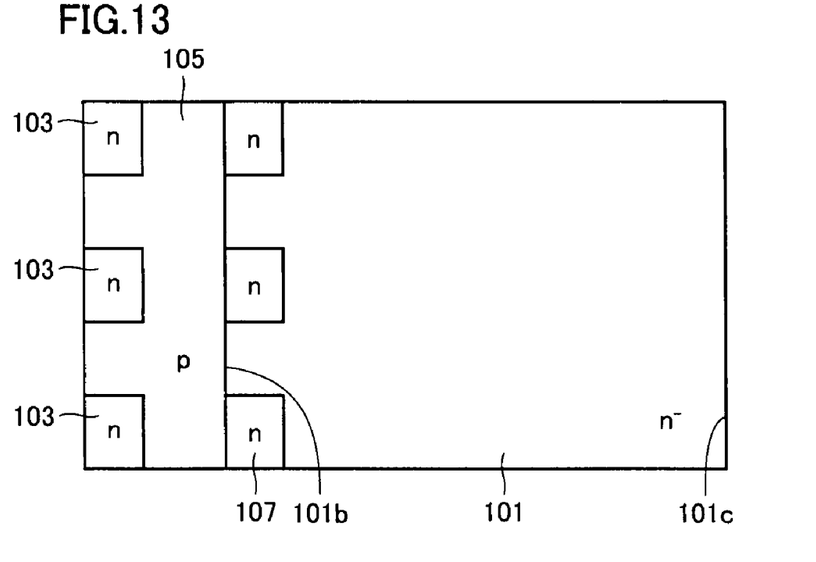
FIG. 13 is a plan view showing distribution of a p-type region and an n-type region in a surface of a semiconductor substrate in the sixth embodiment of the present invention.

Referring to FIGS. 12 and 13, a semiconductor device in the present embodiment is basically configured similarly to the semiconductor device including the MISFET as the semiconductor element in the fourth embodiment, however, it is different in that a semiconductor element 100f is implemented by a lateral MOSFET.

Referring to FIGS. 12 and 13, though the semiconductor device in the present embodiment is configured basically similarly to the semiconductor device in the fifth embodiment, it is different in that source electrode 131 is formed on the surface of n-type source region 103 instead of the emitter electrode, the collector region is not formed in main surface 101a in n⁻ region 101 on the side of the surface (another side surface 101c) opposite to the surface (one side surface 101b) where n-type source region 103 is formed, and drain electrode 133 is formed instead of the collector electrode. As the configuration is otherwise the same as in the first embodiment, description thereof will not be repeated.

Though a method of manufacturing the semiconductor device in the present embodiment is basically the same as that in the fourth embodiment, it is different in forming a lateral MOSFET as semiconductor element 100f.

As the configuration is otherwise substantially the same as in the first embodiment described above, the same elements have the same reference characters allotted and description thereof will not be repeated.

As described above, according to the semiconductor device in the present embodiment, a lateral MOSFET is included as semiconductor element 100f. A lateral MOSFET capable of maintaining a low ON voltage and achieving operation at higher speed by lowering a feedback capacitance can thus be implemented.

Although the present invention has been described and illustrated in detail, it is clearly understood that the same is by way of illustration and example only and is not to be taken by way of limitation, the scope of the present invention being limited only by the terms of the appended claims.

What is claimed is:

1. A semiconductor device, comprising:
a semiconductor substrate having an upper and a lower surface; and
a semiconductor element having an insulated gate field effect portion formed in said semiconductor substrate;
said semiconductor element including
a first region of a first conductivity type formed in said semiconductor substrate,
a source region of the first conductivity type formed in said semiconductor substrate at the upper surface,
a base region of a second conductivity type formed in said semiconductor substrate at the upper surface, and surrounding said source region,
a second region of the first conductivity type formed in said semiconductor substrate at the upper surface, the second region being in contact with said base region on a inner side facing the source region, and being in contact with the first region on an outer side opposite to the inner side, and being opposed to said source region with said base region being interposed, and having an impurity concentration higher than that of said first region,
an insulating film formed on said base region located between said source region and said second region, and
a gate electrode formed on said insulating film,
wherein said first region being adjacent to said base region and to said second region.

2. The semiconductor device according to claim 1, wherein said gate electrode is formed to extend over another region of said base region, other than one region of said base region located between said source region and said second region.

3. The semiconductor device according to claim 2, wherein said insulating film formed over said another region of said base region is larger in thickness than said insulating film formed over said one region of said base region.

4. The semiconductor device according to claim 1, wherein said gate electrode is formed only above said base region located between said source region and said second region.

5. The semiconductor device according to claim 1, wherein said semiconductor element is an IGBT and further has a collector region of the second conductivity type.

6. The semiconductor device according to claim 1, wherein said semiconductor element is a MISFET.

7. The semiconductor device according to claim 1, wherein said second region includes a plurality of second region elements, each of the second region elements separated from each other by the first region and the base region, and arranged along both longitudinal sides of the base region in a horizontal longitudinal direction of the semiconductor substrate.

8. The semiconductor device according to claim 1, wherein said source region includes a plurality of source region elements, each of the source region elements separated from each other by the base region, and each of the source region elements being surrounded by the base region inside the semiconductor substrate so as to electrically insulate the source region elements from each other.

9. The semiconductor device according to claim 7, wherein said source region includes a plurality of source region elements, each of the source region elements separated from each other by the base region, and each of the source region elements being surrounded by the base region inside the semiconductor substrate,
wherein the plurality of second region elements are arranged pairwise on each side of the base region and are aligned pairwise with one of the source region elements.

10. The semiconductor device according to claim 1, wherein a shortest distance of in the upper surface of the source region to the second region is shorter than a shortest distance in the upper surface from the source region to the first region.

* * * * *